US012589918B2

(12) United States Patent
Chiu et al.

(10) Patent No.: US 12,589,918 B2
(45) Date of Patent: Mar. 31, 2026

(54) CONTAINER SYSTEM

(71) Applicant: GUDENG PRECISION INDUSTRIAL CO., LTD, New Taipei (TW)

(72) Inventors: Ming-Chien Chiu, New Taipei (TW); Chia-Ho Chuang, New Taipei (TW); Shu-Hung Lin, New Taipei (TW); Yi-Hsuan Lee, New Taipei (TW); Ting-Syong Wu, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 386 days.

(21) Appl. No.: 17/089,751

(22) Filed: Nov. 5, 2020

(65) Prior Publication Data

US 2021/0300635 A1 Sep. 30, 2021

Related U.S. Application Data

(60) Provisional application No. 62/994,242, filed on Mar. 24, 2020.

(51) Int. Cl.
| | |
|---|---|
| *B65D 43/02* | (2006.01) |
| *B32B 1/00* | (2006.01) |
| *B32B 15/04* | (2006.01) |
| *B65D 85/30* | (2006.01) |
| *H10P 72/10* | (2026.01) |

(52) U.S. Cl.
CPC .............. *B65D 43/02* (2013.01); *B32B 1/00* (2013.01); *B32B 15/043* (2013.01); *B65D 85/30* (2013.01); *H10P 72/1906* (2026.01);

*B32B 2307/728* (2013.01); *B32B 2307/73* (2013.01); *B32B 2439/00* (2013.01)

(58) Field of Classification Search
CPC ......... H01L 21/67359; H01L 21/67369; H01L 21/67353; H01L 21/67386; B65D 43/02; B65D 85/30; B65D 25/02; G03F 1/66; G03F 1/22; G03F 7/70741; G03F 7/7075; H10P 72/1906; H10P 72/1902
See application file for complete search history.

(56) References Cited

U.S. PATENT DOCUMENTS

| | | | | |
|---|---|---|---|---|
| 4,237,526 | A | * 12/1980 | Wood | ...................... F21V 31/03 |
| | | | | 362/267 |
| 5,344,677 | A | * 9/1994 | Hong | ........................ G03F 1/64 |
| | | | | 430/4 |

(Continued)

FOREIGN PATENT DOCUMENTS

| | | |
|---|---|---|
| CN | 101194207 A | 6/2008 |
| CN | 101632163 A | 1/2010 |

(Continued)

*Primary Examiner* — Orlando E Aviles
*Assistant Examiner* — Jenine Spicer
(74) *Attorney, Agent, or Firm* — ScienBiziP, P.C.

(57) ABSTRACT

The instant disclosure discloses a container system, comprising an inner base, configured to receive a workpiece, the inner base including a first treatment area that corresponds to a workpiece accommodating region, a second treatment area arranged around the first treatment area of the inner base, and a workpiece supporting post arranged at a border region between the first treatment area and the second treatment area.

18 Claims, 9 Drawing Sheets

(56) References Cited

U.S. PATENT DOCUMENTS

| | | | | |
|---|---|---|---|---|
| 8,012,586 | B2 * | 9/2011 | Extrand | ................... C09D 1/00 |
| | | | | 428/408 |
| 2002/0006361 | A1 * | 1/2002 | Sanadi | ................. B01L 3/5025 |
| | | | | 356/246 |
| 2006/0225976 | A1 * | 10/2006 | Nakadate | ............. F16F 9/3484 |
| | | | | 188/266 |
| 2006/0266011 | A1 * | 11/2006 | Halbmaier | ........ H01L 21/67017 |
| | | | | 55/385.6 |
| 2010/0276324 | A1 | 11/2010 | Hyobu | |
| 2013/0126378 | A1 * | 5/2013 | Ku | ......................... B65D 85/48 |
| | | | | 206/454 |
| 2013/0248399 | A1 | 9/2013 | Lin et al. | |
| 2014/0116920 | A1 * | 5/2014 | Lee | ................... B65D 81/2015 |
| | | | | 53/485 |
| 2015/0131071 | A1 * | 5/2015 | Kim | ......................... G03F 1/62 |
| | | | | 355/72 |
| 2015/0380293 | A1 * | 12/2015 | Nishijima | ........... H01L 21/6836 |
| | | | | 206/710 |
| 2016/0355001 | A1 * | 12/2016 | Kim | ...................... B32B 37/025 |
| 2017/0294326 | A1 * | 10/2017 | Raschke | ........... H01L 21/67011 |
| 2018/0210349 | A1 * | 7/2018 | Hsueh | ............... H01L 21/67353 |
| 2019/0214287 | A1 * | 7/2019 | Chiu | ................... G03F 7/70741 |

FOREIGN PATENT DOCUMENTS

| | | | |
|---|---|---|---|
| CN | 108375872 | A | 8/2018 |
| JP | 2007-220823 | A | 8/2007 |
| JP | 2012-186391 | A | 9/2012 |
| JP | 2012-255958 | A | 12/2012 |
| JP | 3181255 | U | 1/2013 |
| KR | 10-2012-0081541 | A | 7/2012 |
| TW | 550220 | B | 9/2003 |
| TW | 201321283 | A | 6/2013 |
| TW | 201827920 | A | 8/2018 |

* cited by examiner

300

1012c 1012b 1112c 1112b

1212c

1312c

1412c

CONTAINER SYSTEM

CROSS-REFERENCE TO RELATED APPLICATIONS

This application claims the benefit of U.S. Provisional Patent Application No. 62/994,242 filed on Mar. 24, 2020, which is hereby incorporated by reference herein and made a part of specification.

FIELD

This present disclosure relates to container for storage, transport, shipping and processing of fragile objects such as photomask, reticle, and wafer, and, in particular, to retaining system for storage, transport, shipping, and processing of a reticle for extreme ultraviolet (EUV) lithography process.

BACKGROUND

In semiconductor industry, workpiece containers (e.g., photomask/reticle retainer) have evolved with the heightened precision requirements of the payload thereof, in order to meet the demand for increased level of workpiece protection from potential ambient hazards.

For example, newer generation reticle retainers are sometimes provided with a dual-pod configuration that includes an inner pod for receiving a reticle and an outer pod for accommodating the inner pod. During transportation, a reticle may be packed inside the inner pod. For executing a lithography process, the outer pod may be opened to allow retrieval of the inner pod therefrom. The inner pod may then be opened, prior to subsequent exposure process that uses the contained reticle, upon arriving at a designated position inside an exposure apparatus.

For modern EUV lithography process, as the scaling of critical dimensions (CD) of semiconductor devices becomes more precise, the requirements for clean handling of EUV masks (e.g., reticles) also become more stringent. Accordingly, the control over the environment in which the workpieces are held/storage, and the technology for cleaning the storage environment for the delicate workpiece also become important.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
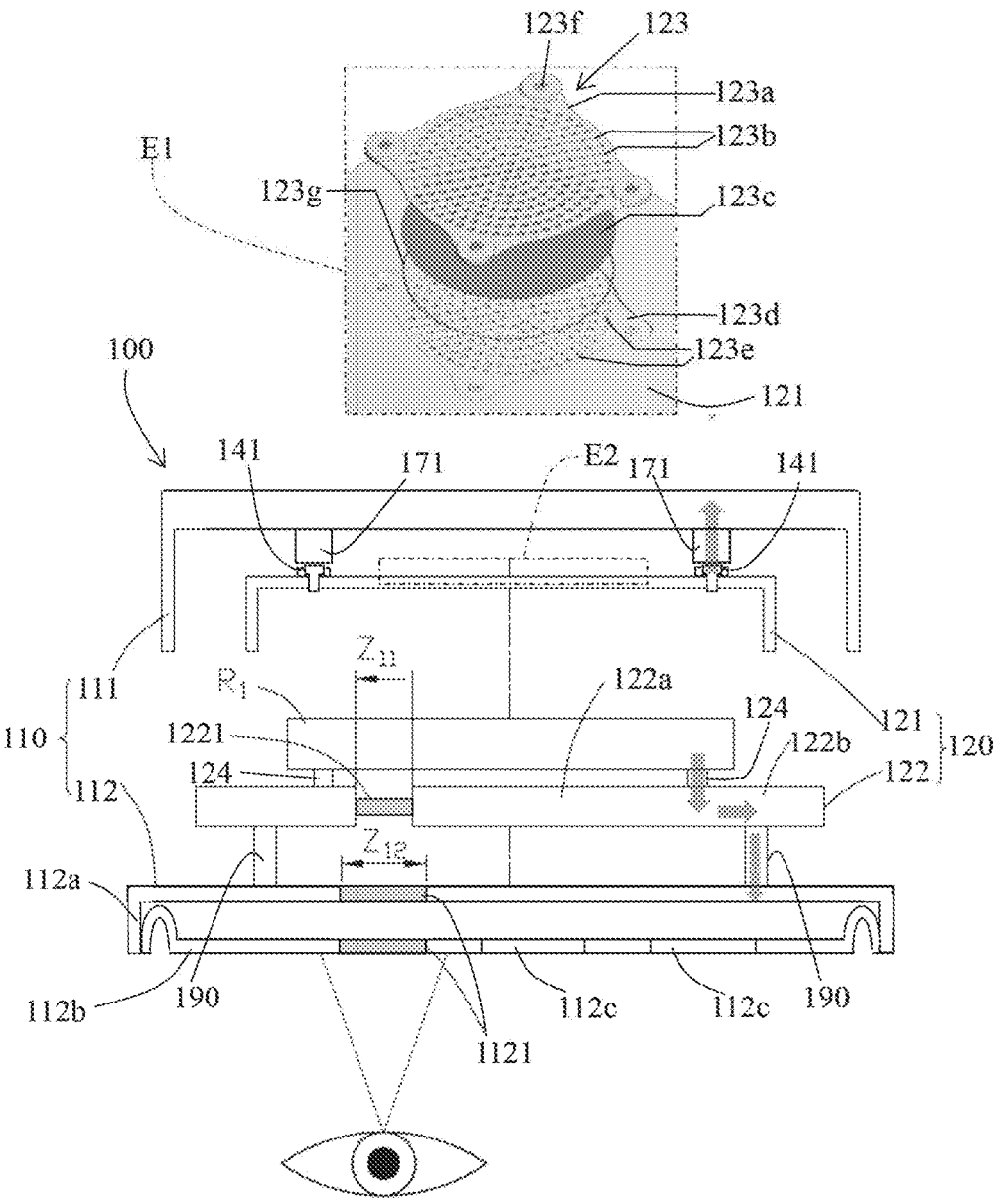
FIG. 1 illustrates a schematic cross-sectional view of a container system in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 14. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a schematic cross-sectional view of a container system in accordance with some embodiments of the instant disclosure. For illustrational simplicity and clarity, some detail/sub components of the exemplary device are not explicitly labeled/shown in the instant figure. The doted frame E1 shows an enlarged isometric view of a portion of a container system in accordance with some embodiments of the instant disclosure that is enclosed in the doted frame E2 of FIG. 1.

Referring to FIG. 1, the exemplary container system 100 comprises an outer pod 110 and an inner pod 120 configured to be received by the outer pod 110. The inner pod 120 is configured to receive a workpiece (e.g., a reticle). In the illustrated embodiment, the inner pod 120 includes a first cover (e.g., the inner cover 121) that defines a workpiece accommodating region 122a at a geometric central region thereof. The workpiece accommodating region 122a is surrounded by a periphery region 122b. The inner pod 120 further includes a first cover (e.g., the inner cover 121) configured to establish engagement with the periphery region 122b of the inner base 122, so as to cooperatively form an interior volume upon enclosure for accommodating a workpiece (e.g., reticle $R_1$).

In order to provide thorough protection to its sensitive and fragile content, in some embodiments, the inner cover 121 and the inner base 122 may be provided with electromagnetic interference (EMI) shielding property. Suitable material for providing EMI shielding capability may include conductive material such as metal. In some embodiments, the inner base and the inner cover are substantially made of metal. In some embodiments, metallic coating (such as copper or gold) may be provided over the surface of the inner pod 120. In some embodiments, both the inner cover 121 and inner base 122 are made of metal material, such as aluminum.

As shown in FIG. 1, the exemplary outer pod 110 is configured to house the inner pod 2. In the illustrated embodiment, the outer pod 110 comprises a second base (e.g., outer base 112) configured to receive the inner base 122 and a second cover (e.g., outer cover 111) configured to engage the outer base 112 (and cover the inner pod 120). In some embodiments, either one or both of the outer base 112 and the outer cover 111 may be provided with static charge dissipation property. In some embodiments, the outer pod 110 may be constructed from polymer material mixed with conductive fibers. For instance, in some embodiments, either one or both of the outer cover 111 and outer base 112 are made from carbon fibers embedded resin material.

In some embodiments, the inner cover 121 is configured to establish sealing engagement with the periphery region 122b of the inner base 122. In some embodiments, the inner cover 121 may be configured to establish pressing engagement with the inner base 122 through pressure from the outer cover 111 upon enclosure between the outer base 112 and the outer cover 111. In some embodiments, a pressing engagement between the inner cover 121 and the inner base 122 may be formed through a substantially planar metal to metal interface. In general, the pressing engagement establishes a sealing enclosure that prevents dust and humidity from entering into the interior volume through the contact interface between the upper and lower members of the inner pod 120. In some embodiments, either or both of the inner cover 121 and the inner base 122 may be provided with additional sealing element (e.g., sealing gasket or O-ring) at the respective engaging interface region to further enhance interdicting capability against ambient contamination.

In some embodiments, the inner pod 120 may be provided with a supporting element (e.g., workpiece supporting post 124) arranged on a top surface of the inner base 122 for receiving a workpiece (e.g., reticle $R_1$). In some embodiments, a pressing unit (e.g., hold down pin 141) may be provided on a top surface of the inner cover 121 for pressing/holding the workpiece.

In some embodiments, the outer pod 110 may include a supporting structure 190 arranged on the outer base 112 configured to support the inner pod 120. In some embodiments, the outer base 112 and the supporting structures 190 are integrally formed in one piece. In some embodiments, the supporting structures 190 are to be mounted on the top surface of the outer base 112. The illustrated outer pod 110 is further provided with a pushing element 171 arranged in correspondence with the hold down pin 141 of the inner pod 120. In some embodiments, the outer cover 111 and the pushing elements 171 are integrally formed in as one structural unit. In some embodiments, the pushing elements 171 are mounted at a surface of the outer cover 111 that faces the inner cover 121. When the outer cover 111 is coupled to the outer base 112, the pushing element 171 pushes the hold down pin 141 to press/hold the workpiece $R_1$, thereby restraining movement of the workpiece upon receipt.

In some embodiments, the pushing element 171 and the hold down pins 141 are further provided with charge dissipation property. Accordingly, when the outer cover 111 is coupled to the outer base 112, the pushing element 171 pushes the hold down pin 141 to press the workpiece $R_1$ and establishes a charge dissipation paths (indicated by shaded arrows in the instant figure) from the received workpiece $R_1$, through the hold down pin 141 and the pushing element 171, to the outer cover 111. In some operation scenarios, the outer cover 111 may be grounded, so as to allow accumulated charges on the received workpiece R to be dissipated through the charge dissipation path to the ground. The material for the hold down pin 141 may comprise conductive or static dissipative material, thereby making the hold down pin 141 part of the discharge dissipating path to enable grounding there-though. In some embodiments, the hold down pin 141 and the pushing element 171 are provided with surface resistance value in a range from about $10^6$ to $10^{11}\Omega$. In some embodiments, the hold down pin 141 and the pushing element 171 are provided with surface resistance value less than about $10^5 \Omega$.

In some embodiments, the workpiece supporting posts 124 of the inner pod 120 and the supporting structure 190 of the outer pod 110 are further provided with charge dissipation property. For example, the workpiece supporting posts 124 and the supporting structure 190 may be provided with charge dissipating surface coatings. Accordingly, when the outer cover 111 is coupled to the outer base 112 (and thus the workpiece supporting posts 124 on the inner base 122 establishes contact with the workpiece $R_1$), a charge dissipation path (indicated by shaded arrows in the instant figure) may be formed from the received workpiece R, through the supporting element 124, the inner base 122 and the supporting structure 190, to the outer base 112. In some embodiments, the outer base 112 is grounded to allow dissipation of accumulated charges on the received workpiece $R_1$ (through the charge dissipation path to the ground). In some embodiments, the material of the inner pod 120 may also comprise conductive or static dissipative material, thereby making the inner pod 120 part of the discharge dissipating path to enable grounding there-though. In some embodiments, the workpiece supporting posts 124 and the supporting structure 190 have surface resistance value in a range from about $10^6$ to $10^{11} \Omega$. In some embodiments, the workpiece supporting posts 124 and the supporting structure 190 have surface resistance value less than about $10^5 \Omega$.

As shown in FIG. 1, the exemplary system has a first observable zone $Z_{11}$ defined in the workpiece accommodating region 122a of the inner base 122 to allow observation of the reticle $R_1$. In some embodiment, the first observation zone Zu may be provided with a window that comprises a signal transmissive structure (e.g., an opening or a signal transmissive member). For example, the exemplary inner base 122 includes an inner optical member 1221 arranged in the first observable zone $Z_{11}$. In some embodiments, the inner optical member 1221 may be made of a signal transmissive material with respect to infrared light, visible light, or ultraviolet signal. Suitable material of the inner optical member 1221 may include glass (e.g., quartz glass), acrylic, transparent plastic, or other comparable materials. In the illustrated embodiment, the inner optical member 1221 may include a piece of quartz glass embeddedly arranged in the inner base 122 (in the workpiece accommodating region 122a).

In the instant embodiment, the first observable zone Zu is correspondingly designed to allow observation of a first identification feature (e.g., a 1-D or 2-D bar code) of the reticle $R_i$ upon receipt of the reticle $R_1$ (not explicitly shown in the schematic illustration). In some embodiments, the first identification feature of the reticle $R_1$ is formed on a window-facing surface in the first observable zone $Z_{11}$.

The outer base 112 has a second observable zone $Z_{12}$ defined thereon. The second observable zone $Z_{12}$ is arranged to be observably aligned to the first observable zone $Z_{11}$ of the inner pod 120. As such, quick visual identification or optical confirmation (such as the condition of the reticle $R_1$ and the first identification) of the reticle $R_1$ retained in the container system 100 may be achieved by optical scanning through the second observable zone $Z_{12}$ and first observable zone Zu without the need to open up the workpiece container. Accordingly, the frequency of pod opening may be reduced during semiconductor fabrication process, which in turn minimizes exposure of the sensitive precision workpiece to the potentially hazardous ambient factors.

In the illustrated embodiment, outer base 112 has a hollow body comprising an upper deck 112a configured to support the inner base 122 and a lower deck 112b opposite to the upper deck 112a. In some embodiments, both of the exemplary upper deck 112a and the lower deck 112b may be provided with a structure of substantially horizontal plate. The exemplary lower deck 112b is configured to seal the upper deck 112a. In some embodiments, the lower deck 112b and the upper deck 112a are integrally formed. The exemplary second observable zone $Z_{12}$ is provided with a window that includes two overlapping signal transmissive structure (e.g., outer optical members 1121) respectively arranged in the upper and the lower deck 112a, 112b.

In some embodiments, the outer optical member 1121 embedded in the upper deck 112a and/or the lower deck 112a may be made of a signal transmissive material with respect to infrared light, visible light, or ultraviolet. Suitable material of the outer optical member 1121 may include glass (e.g., quartz glass), acrylic, transparent plastic, or comparable materials. In some embodiments, a transmittance value of the outer optical member 1121 is greater than 80% with respect to optical signals in one or more of the abovementioned spectrum ranges. Depending on specific applicational requirement, in some embodiments, the optical members (e.g., outer optical members and/or inner optical member) may include concave/convex surface.

In some embodiments, the inner optical member 1221 has a lower reflectance value than the outer optical member 1121 with respect to wavelength in a range between 600 nm to 950 nm. In some embodiments, the corresponding wavelength range for the optical members may be in a range of about 630 nm to 930 nm. In some embodiments, a reflectance value of the outer optical member 1121 with respect to the abovementioned wavelength range may be less than 15%. In some embodiments, a reflectance value of the inner optical member 1221 with respect to the abovementioned range of wavelength may be less than 0.5%. In some embodiments, the inner optical member 1221 may be further provided with an anti-reflection coating. In some embodiments, the inner optical member 1221 may be further provided with a layer having EMI shielding property.

In some embodiments, the inner optical member 1221 may be sealingly installed in the first observable zone $Z_{11}$. For example, the construction of the inner optical member 1221 may include a sealing member around the optically transmissive member (e.g., O-ring). In general, the construction of the inner optical member 1221 provides a sealing enclosure capable of sufficiently preventing dust and humidity from entering into the interior volume through the structural interface between the optical member and the inner base. In some embodiments, the optical member 1221 may be constructed to achieve airtight level sealing.

In some embodiments where dust-resisting and/or dust-proofing requirement is stringent, the outer optical member 1121 in the second observable zone $Z_{12}$ of the outer base 112 may be provided with similar sealing mechanism. However, in applications where inner sealing alone is sufficient, the outer optical member 1121 may be constructed without utilizing sealing mechanism for reduction of structural complexity, weight, and cost concerns.

In some scenarios, volatile gas released from residual chemical solution on the workpiece (e.g., reticle $R_1$) may lead to adverse effect to workpiece (e.g., reticle $R_1$). In some embodiments, clean gas may be purged into the inner pod (e.g., inner pod 120) to alleviate the adverse effect. In some embodiments, the inner pod (e.g., inner pod 120) may be further provided with a filter module (e.g., filter module 123) to maintain the cleanliness of the purged gas. For example, the inner cover 121 comprises a filter module 123 including a filter cover 123a having a plurality of through holes 123b formed thereon, and a filter sheet 123c sandwiched between the filter cover 123a and the inner cover 121. In the illustrated embodiment, the geometric central region of the inner cover 121 is formed with a recess feature 123d for receiving the filter cover 123a, and a plurality of holes 123e arranged through the inner cover 121. The filter cover 123a is configured to be mounted on (e.g. by fasteners 123f) the inner cover 121 thereby bringing the holes 123e arranged through the inner cover 121 into alignment with the through holes 123b of the filter cover 123a. In some embodiments, the filter module 123 may be further provided with a sealing member (e.g. ring 123g) for enhancing the sealing engagement between the filter cover 123a and the inner cover 121. For example, the filter module 123 further comprises a sealing ring 123g arranged between the periphery of the filter cover 123a and the inner cover 121 (e.g., a top surface of the recess feature 123d). In some embodiments, the periphery of the filter cover 123a may be formed with a downward facing annular groove for accommodating the sealing ring 123g.

After the container is washed/cleaned, water residual may remain in the hollow body of the outer base 112. In order to allow the water residual to flow out of the hollow body, in some embodiments, an outer base (e.g., outer base 112) is provided with a drain hole. For example, the exemplary lower deck 112b of the outer base 112 is provided with a plurality of drain holes 112c. The drain holes 112c in the lower deck 112b allow the residual water flows out of the hollow body thereby reducing the amount of residual water in the outer pod base, which may shorten the baking time of the outer pod 110. In some embodiments, an upper surface of the outer base (e.g., upper deck 112a) is free of drain hole in order to maintain the sealing engagement between outer pod base and lid.

In some scenarios, after the container system is cleaned (e.g., washed), there may be water residual on the surface thereof. The water residual may attract dirt thus increase the possibility of contamination of the workpiece (e.g., EUV reticle). By changing the surface characteristics of the inner pod, the inner pod may be dried more easily after cleaning. Accordingly, baking/drying time after cleansing process may be reduced. Moreover, surface treatment (e.g., hydrophobic treatment) of the inner pod (e.g., inner pod 120) may reduce stiction of fine dusts and make it easier to wash them away, thereby increasing the dust-proofing ability of the inner pod. In some embodiments, the modification of surface characteristics may be conducted by immersion of alkaline based solution(s) (such as potassium carbonate and sodium hydroxide), spraying or evaporation of fluorine-containing coatings, electroplating or electroless plating, or laser ablation to alter surface roughness, thereby modifying the hydrophilicity and hydrophobicity of the treated surface.

Figure 2A:
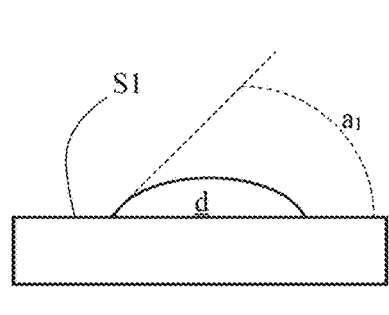
FIG. 2*a* illustrates a schematic regional cross-sectional view of a droplet on a surface without hydrophobic treatment in accordance with some embodiments of the instant disclosure.
Figure 2B:
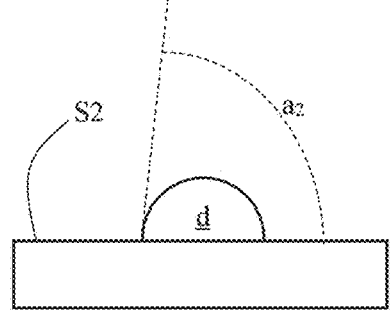
FIG. 2*b* illustrates a schematic regional cross-sectional view of a droplet on hydrophilic treated surface in accordance with some embodiments of the instant disclosure

FIGS. 2a and 2b respectively illustrates a schematic regional cross-sectional view of a droplet d on a surface S1 of an inner pod without hydrophobic treatment (or, with hydrophilic treatment), and a droplet d on hydrophilic treated surface S2 of an inner pod in accordance with some embodiments of the instant disclosure. In the illustrated embodiments, a wetting angle $a_1$ (e.g., less than 50 degree) shown in FIG. 2a is smaller than a wetting angle $a_2$ (e.g., more than 50 degree) shown in FIG. 2b. A large wetting angle (e.g., the angle between the surface of the liquid and the outline of the contact surface) may be observed for droplet on the hydrophobic-treated surface (e.g., S2). Such a large wetting angle of the residual droplet may be helpful to shorten the baking time of the inner pod (e.g., inner pod 120).

In addition, the inner pod (e.g., inner pod 120) may be divided into different regions, on which different surface treatments of hydrophilicity and hydrophobicity may be applied. Such arrangement may prevent contamination to a received workpiece (e.g., reticle) due to water condensation caused by change of ambient condition. In some embodiments, one or both the inner cover (e.g., inner cover 121) and the inner base (e.g., inner base 122) may be surface-treated in its entirety. In some embodiments, one or both the inner cover (e.g., inner cover 121) and the inner base (e.g., inner base 122) may be surface-treated partially/selectively.

For example, the interior surface of the inner cover (e.g., the inwardly exposed surface of the inner cover 121 upon closure of the inner pod) and the inner base (e.g., the inwardly exposed surface of the inner base 122 upon closure of the inner pod) may receive hydrophilic treatment (e.g., at regions that correspond to the normal projection of a received reticle). In some embodiments, the interface between the inner cover and the inner base may be hydrophobic-treated. In some embodiments, the remaining area (e.g., outward facing/exterior surface) of the inner base/inner cover may be hydrophobic-treated.

Figure 2C:
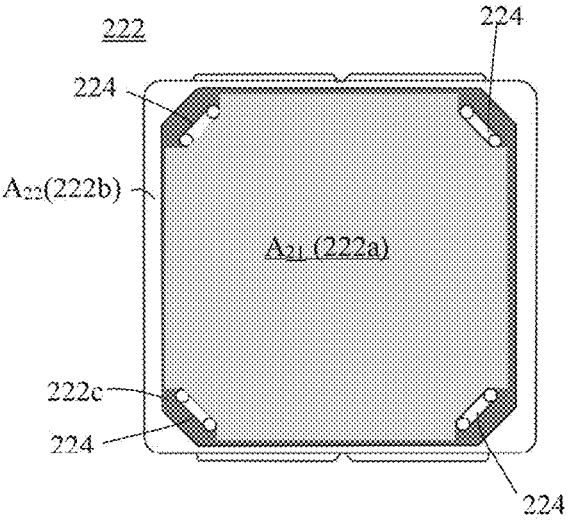
FIG. 2*c* illustrates a schematic plane view of an inner base in accordance with some embodiment of the instant disclosure.
Figure 2D:
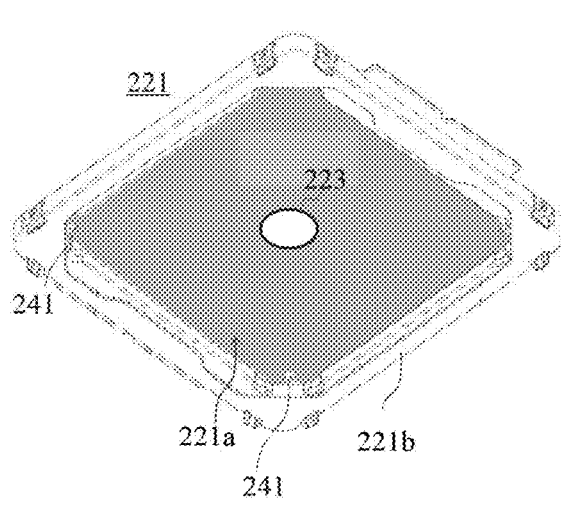
FIG. 2*d* illustrates a schematic view of an inner cover in accordance with some embodiment of the instant disclosure.

FIG. 2c illustrates a top view of an inner base in accordance with some embodiments of the instant disclosure. FIG. 2d illustrates a bottom view of an inner cover in accordance with some embodiments of the instant disclosure. For illustrational simplicity and clarity, some detail/sub components of the exemplary device are not explicitly labeled/shown in the instant figure.

Referring to FIG. 2c, the exemplary inner base 222 includes a first treatment area that corresponds to the workpiece accommodating region 222a. For example, the shaded region $A_{21}$ that represents the first treatment area has a surface area substantially equal to that of the exemplary workpiece accommodating region 222a. In some embodiments, the first treatment area comprises a hydrophilic treatment area. Upon occurrence of water condensation due to ambient condition changes (e.g., equipment malfunction), water droplets occurred in the workpiece accommodating region 222a (e.g., the inner central region under the normal projection of a received reticle) may have a smaller wetting angle (which translates to a lower overall droplet height), thus reducing the likelihood of coming into contact with a stored reticle. In some embodiments, the first treatment area (e.g., shaded region $A_{21}$) may be arranged smaller or larger than the workpiece accommodating region 222a.

In some embodiments, the interior surface (e.g., at a periphery area 222b) of the inner base (e.g., inner base 222) is further treated with a second surface treatment. For instance, the inner base 222 includes a second treatment area 222b (e.g., the periphery area) arranged around the first treatment area $A_{21}$ of the inner base. In some embodiments, the second treatment area $A_{22}$ comprises a hydrophobic treatment area. The inner base 222 provided with the hydrophobic treatment may be dried more easily after cleaning. In some embodiments, the outer surface of the inner base (e.g., exterior surface of the inner base 222) may be further treated with hydrophobic treatment.

In the illustrated embodiment, the workpiece accommodating region 222a of the inner base 222 is arranged generally at a geometric central region thereof and is further surrounded by an annular recess 222c. The exemplary second treatment area $A_{22}$ is arranged to fully surround the annular recess 222c. The workpiece accommodating region 222a that receives the first surface treatment may be provided with a substantially flat surface.

The inner base 222 may be further provided with a workpiece supporting post 224 configured to limit the lateral motion of the workpiece. In some embodiments, the workpiece supporting posts 224 are arranged at a border region (e.g., the annular recess 222c) between the first treatment area 222a and the second treatment area 222b. In some embodiments, the border region may be defined by the boundary (e.g., the contour of the shaded region $A_{21}$ shown in FIG. 2c) between the annular recess 222c and the workpiece accommodating region 222a. In some embodiments, the second treatment is further applied in the annular recess 222c. In some embodiments, a region between the inner base 222 and the workpiece supporting posts 224 (e.g., a region of the inner base where the post is mounted) is not hydrophobic-treated.

Referring to FIG. 2d, the exemplary inner cover 221 is configured to match the inner base (e.g., inner base 222). The inner cover 221 includes a first treatment area 221a that corresponds to the workpiece accommodating region (e.g., workpiece accommodating region 222a) of the inner base. In some embodiments, the first treatment area 221a includes a hydrophilic treatment area. In the illustrated embodiment, the first treatment area evades the filter module 223 (shown to be arranged at the geometry central region of the inner cover). In some embodiments, the first treatment area comprises a hydrophilic treatment area that evades the filter module 223. In some embodiments, the filter module 223 can be surface treated (e.g., hydrophobic surface treatment). For example, the filter cover (e.g., filter cover 123a shown in FIG. 1) can be surface treated in whole or in part to make it hydrophobic.

In some embodiments, the inner cover 221 further includes a second treatment area 221b arranged around the first treatment area 221a of the inner cover 221. In some embodiments, the second treatment area comprises a hydrophobic treatment area. In some embodiments, the outer surface of the inner cover (e.g., exterior surface of the inner cover 221) may be further treated with hydrophobic treatment.

In some embodiments, the inner cover is further provided with a hold down pin 241 arranged in the second treatment area of the inner cover (e.g., the hold down pin 241 is arranged on the top surface of the inner cover 221). In some embodiments, the hold down pin 241 itself may be treated with the second treatment.

In some embodiments, the inner base 222 and the inner cover 221 are substantially made of metal. Furthermore, the hydrophobic treatment area is provided with a surface resistance value is less than about $10^{11}\Omega$. For example, the hydrophobic coating over the inner pod is kept below 1 um to maintain static charge dissipating capability. In some embodiments, a hydrophobic layer over the hydrophobic treatment area has a thickness of less than about 1 um. When the thickness of the hydrophobic coating on the filter cover is less than 1 um, the effect of the coating on the electrostatic conductivity of the filter cover may be accepted. In some embodiments, when the filter cover (e.g., the filter cover 123a) is hydrophobic-treated with a fluorine-containing coating, the thickness of the hydrophobic coating of the filter cover may be about 5 um-60 um. In some embodiments, the supporting post of the inner base is provided with charge dissipation property.

Figure 3:
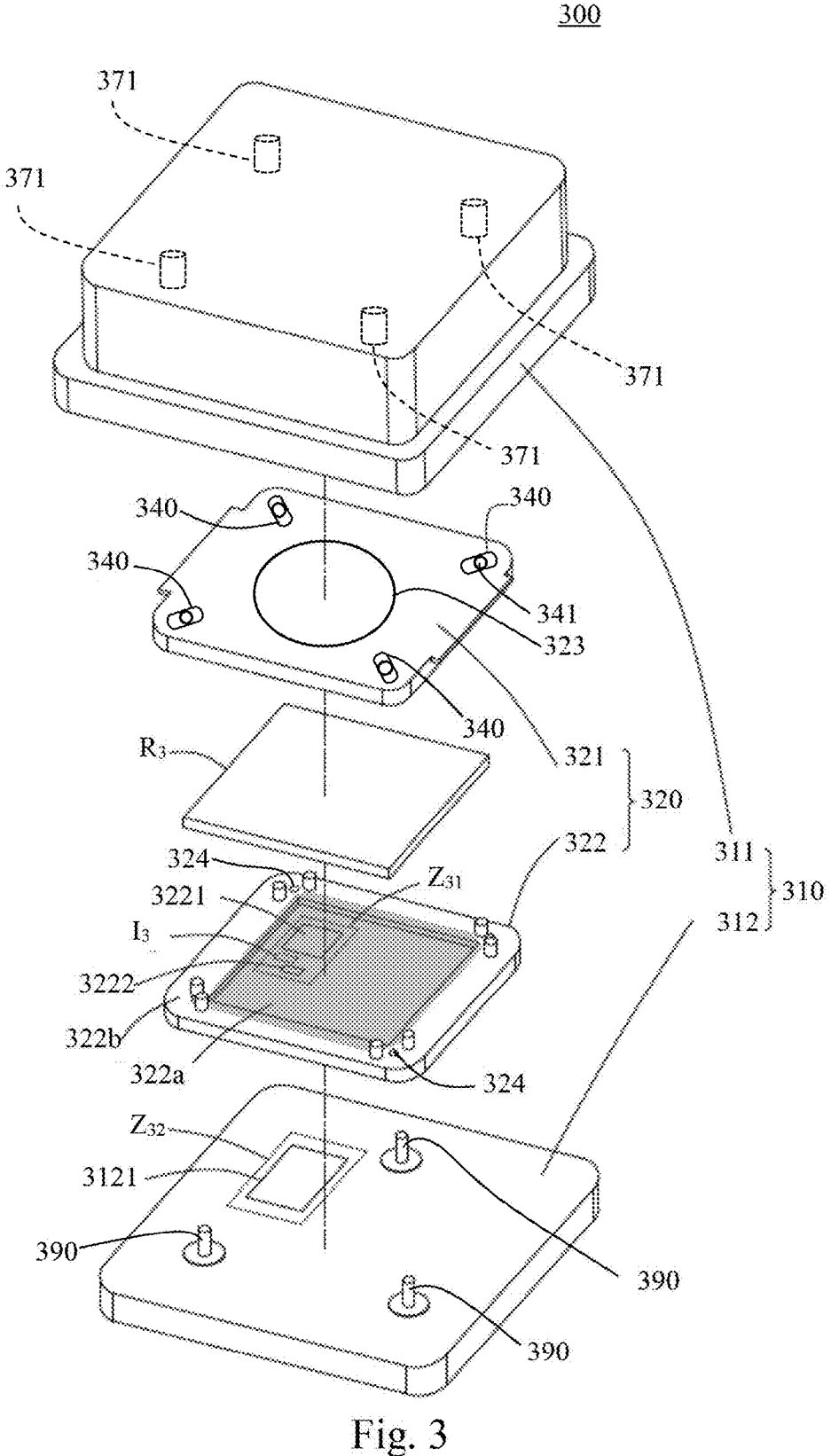
FIG. 3 illustrates an isometric exploded view of a container system in accordance with some embodiment of the instant disclosure.

FIG. 3 illustrates an isometric exploded view of a container system in accordance with some embodiment of the instant disclosure. For illustrational simplicity and clarity, some detail/sub components of the exemplary device are not explicitly labeled in the instant figure.

The exemplary container system 300 comprises an outer pod 310 and an inner pod 320 configured to be disposed therein. The inner pod 320 is configured to receive a workpiece (e.g., reticle). The inner pod 320 includes an inner base 322 and an inner cover 321. The inner base 322 defines a workpiece accommodating region 322a that is surrounded by a periphery region 322b. The inner cover 321 is configured to establish engagement with the periphery region 322b of the inner base 322, so as to cooperatively define an interior volume upon enclosure for accommodating a workpiece (e.g., reticle $R_3$).

The outer pod 310 is configured to house the inner pod 320. In the illustrated embodiment, the outer pod 310 comprises an outer base 312 configured to receive the inner base 322, and an outer cover 311 configured to engage the outer base 312 and cover the inner pod 320.

In some embodiments, the inner cover 321 may be configured to establish sealing engagement with the periphery region 322b of the inner base 322. For example, the inner cover 321 may be configured to be pressed by the outer cover 311 upon the engaging between outer base 312 and outer cover 311.

In some embodiments, the inner cover 321 and the inner base 322 may be provided with electromagnetic interference (EMI) shielding property, thereby reducing adverse impact on the workpiece (e.g., reticle $R_3$). In some embodiments, suitable material and construction of the inner cover 321 and the inner base 322 may be comparable to that described in the previous embodiments. In the illustrated embodiment, both of the inner cover 321 and the inner base 322 are made of aluminum using, e.g., computer numerical control (CNC) machining technique.

The exemplary inner pod 320 is provided with a filter module 323 and further includes four workpiece supporting posts (e.g., 324) arranged on a top surface of the inner base 322 for receiving a workpiece (e.g., reticle $R_3$) and four pressing units 340 (each includes a hold down pin 341) arranged on a top surface of the inner cover 321 for pressing/holding the workpiece (e.g., reticle $R_3$).

The exemplary outer pod 310 includes three supporting structures 390 arranged on the outer base 312 and four pushing elements 371 located corresponding to the four hold down pins 341 of the inner pod 320. When the outer cover 311 is coupled to the outer base 312, the four pushing elements 371 pushes the hold down pins 341 to press/hold the four corners of the workpiece $R_3$. As shown in the instant figure, a first observable zone $Z_{31}$ is defined in the workpiece accommodating region 322a of the inner base 322 to allow observation of the reticle $R_3$. In the illustrated embodiment, the inner base 322 includes two inner optical members 3221, 3222 embedded in the first observable zone $Z_{31}$.

In the illustrated embodiment, the inner base 322 comprises a third identification feature $I_3$ at a bottom side thereof. In some embodiments, the third identification feature $I_3$ may include a two-dimensional bar code such as a quick response code (QR code). In some embodiments, the third identification feature $I_3$ may be a visual graphical feature for indicating the orientation of inner pod 320 relative to the outer pod 310. For instance, the third identification feature $I_3$ may include an asymmetric pattern.

The outer base 312 has a second observable zone $Z_{32}$ defined thereon observably aligned to the first observable zone $Z_{31}$ of the inner pod 320 upon receiving the inner pod 310. As such, confirmation on information (such as the condition or status of the reticle $R_3$ and the first identification $I_1$ thereof) of the reticle $R_3$ retained in the container system 300 may be achieved simply via scanning through the second observable zone $Z_{32}$ and first observable zone $Z_{31}$, thereby reducing the number of times the outer pod 310 has to be opened. A scanner S (shown in FIG. 4) may be provided to scan the third identification feature Is of the inner pod 320 through the out optical member 3121 so as to identify the orientation of the inner pod 320. Subsequent adjustment may be made to fine-tune the orientation.

In the illustrated embodiment, the outer base 312 has an outer optical member 3121 embedded in the second observable zone $Z_{32}$. In some embodiments, the outer optical member 3121 may be made of an optically transmissive material with respect to infrared light, visible light, or ultraviolet. In some embodiments, a transmittance value of the outer optical member 3121 is greater than 80%. Suitable material of the outer optical member 3121 may be comparable to that of the outer optical member described in previous embodiments.

In some embodiments, the inner optical member 3221 (and/or 3222) possesses a lower reflectance value than the outer optical member 3121 with respect to wavelength in a range between 600 nm to 950 nm. In some embodiments, the corresponding wavelength range for the optical members may be in a range of about 630 nm to 930 nm. In some embodiments, a reflectance value of the outer optical member 3121 with respect to the corresponding wavelength range may be less than about 15%. In some embodiments, a reflectance value of the inner optical member 3221 with respect to the corresponding wavelength range may be less than about 0.5%. In some embodiments, the inner optical member 3221 (and/or 3222) may be further provided with an anti-reflection coating. The anti-reflection coating may be attributed to a low reflectance value of the inner optical member 3221.

In some embodiments, the two inner optical members 3221, 3222 may be sealingly installed in the first observable zone $Z_{31}$. In some embodiments, the two inner optical members 3221, 3222 may be made of an optically transmissive material with respect to infrared light, visible light, or ultraviolet. In some embodiments, suitable material of two inner optical members 3221, 3222 may be comparable to that described in the previous embodiments. In some embodiments, the exemplary outer optical member 3121 may be sealingly installed in the second observable zone $Z_{32}$.

In some embodiments, a number of window in the first observable zone of the inner base is greater than that in the second observable zone. For example, in the illustrated embodiments, the first observable zone $Z_{31}$ is provided with two windows (e.g., the two inner optical members 3221, 3222); the number of window (e.g., the outer optical member 3121) in the second observable zone $Z_{32}$ is one.

The inner base 322 is provided with a first treatment area (e.g., a hydrophilic area indicated by the shaded area in FIG. 3) and a second treatment area (e.g., a hydrophobic area) arranged around the first treatment area. The workpiece supporting post 324 is arranged at a border region between the first and the second treatment area. The exemplary first treatment area (e.g., the shaded area) includes top surface of the inner optical members 3221, 3222. In some embodiments, a bottom surface of the inner optical members 3221, 3222 is provided with hydrophobic treatment.

Figure 4:
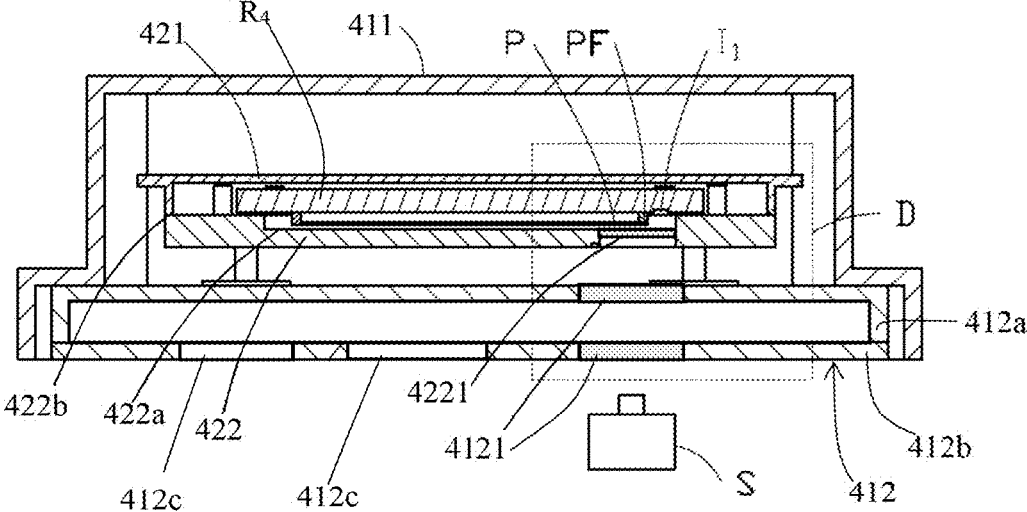
FIG. 4 illustrates a schematic cross-sectional view of a container system in accordance with some embodiments of the instant disclosure.
Figure 5:
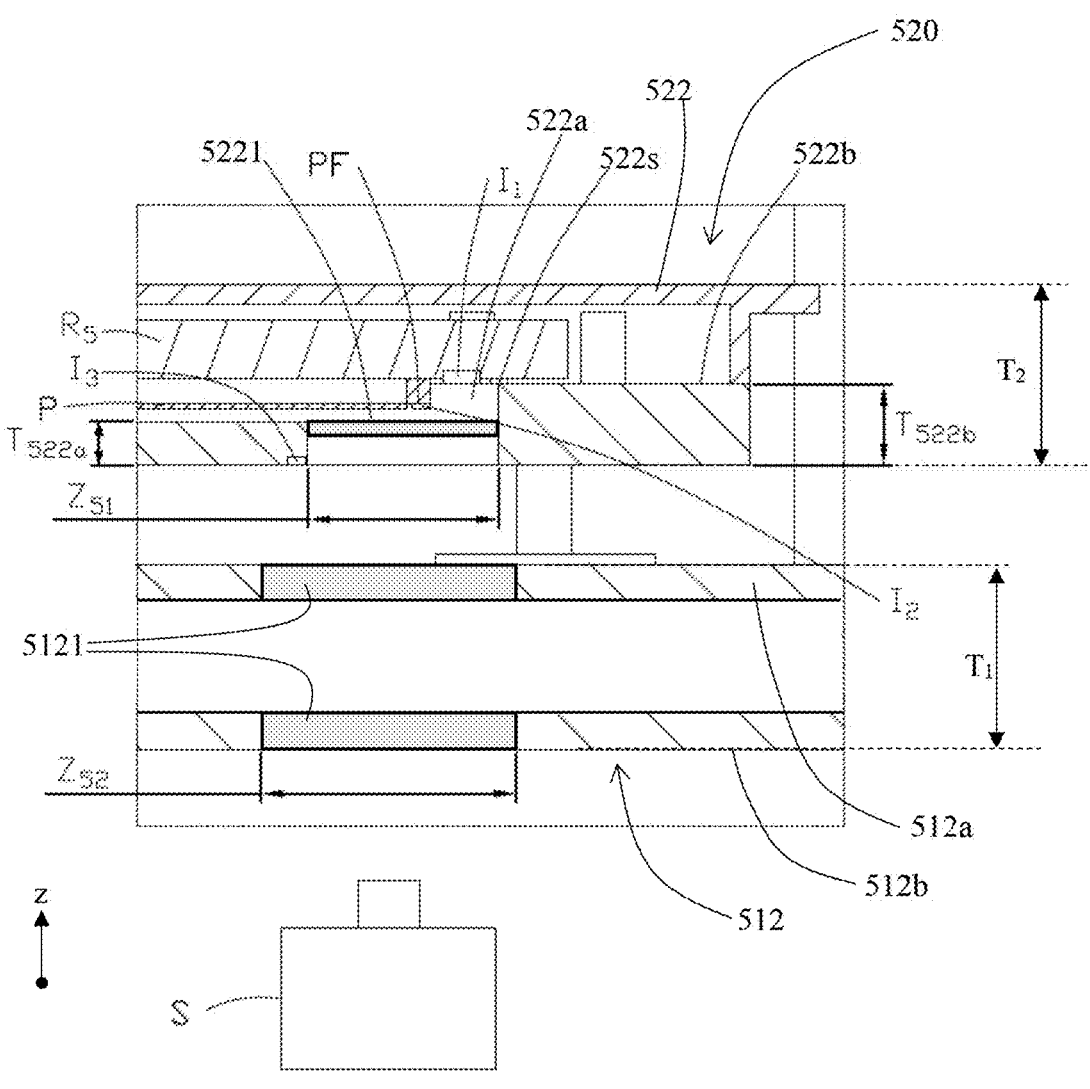
FIG. 5 illustrates a schematic regional cross-sectional view of a container system in accordance with some embodiments of the instant disclosure.

FIGS. 4 and 5 respectively illustrate a cross-sectional view and a regional cross-sectional view of a reticle retaining system in accordance with some embodiments of the instant disclosure. For illustrational simplicity and clarity, some detail/sub components of the exemplary device are not explicitly labeled in the instant figure. In some embodiments, the FIG. 5 may be a regional cross-sectional view taken in a doted box D indicated in FIG. 4.

FIG. 4 shows a workpiece (e.g., reticle $R_4$) being received in a workpiece accommodating region 422a over an inner base 422. A periphery region 422b of the inner base 422 is shown to be in pressing engagement with an inner cover 421. In some embodiments, the workpiece accommodating region 422a may be arranged generally at a geometric central region thereof and surrounded by the periphery region 422b. In the illustrated embodiment, the reticle $R_4$ includes a first identification feature $I_1$ (e.g., a two-dimensional bar code), a pellicle P arranged proximate the first identification feature $I_1$ and a pellicle frame PF arranged therebetween. A second identification feature $I_2$ (as shown in FIG. 5) is disposed on the pellicle frame PF. A scanner S may be provided to read the first identification feature $I_1$ through an outer optical member 4121. A portion of the pellicle P and the pellicle frame PF may be observed/inspected (e.g., via an interferometer) through the outer optical members 4121 and an inner optical member 4221.

The exemplary outer base 412 has a hollow body comprising an upper deck 412a configured to support the inner base 422 and a lower deck 422b opposite to the upper deck 412a, the lower deck 412b is provided with a drain hole pattern having a plurality of drain holes 412c. The drain holes 412c in the lower deck 412b are configured to allow the residual water flows out of the hollow body thereby reducing the amount of residual water in the outer base 412.

In the illustrated embodiment, the two outer optical members 4121 are respectively mounted in the upper deck 412a and the lower deck 412b of the outer base 412. The two outer optical members 4121 are arranged in alignment with the inner optical member 4221.

In some embodiments, the inner pod 420 may be further provided with a first treatment area and a second treatment area comparable to that of the previous embodiments. A workpiece supporting post (no shown in the current cute view) may be further arranged at a border region between the first and the second treatment area.

Referring to FIG. 5, in the illustrated embodiment, the arrangement of the first observable zone $Z_{51}$ is correspondingly designed to allow observation of the first identification feature $I_1$ of the workpiece (e.g., reticle $R_5$), the second identification feature $I_2$ of the pellicle frame PF, a portion of the pellicle P, and a portion of the pellicle frame PF upon receiving the reticle $R_5$.

The workpiece accommodating region 522a of the inner base 522 includes a step profile 522s in a cross section thereof having a thickness $T_{522a}$ smaller than a thickness $T_{522b}$ of the periphery region 522b. In the illustrated embodiment, a periphery of the reticle $R_5$ is supported above the step profile 522s while the pellicle P and the pellicle PF are arranged projectively surrounded by the step profile 522s. In some embodiments, the step profile 522s may projectively (e.g., along the z direction shown in the instant figure) overlap the outer optical member 5121.

In some embodiments, a status of the workpiece $R_5$ (e.g., presence of a workpiece $R_5$ (e.g., reticle), serial number thereof, the orientation thereof) may be identified with a scanner S through the outer optical member 5121 and the inner optical members (e.g., the viewable member 5221 from current sectional view) without the need to open the reticle retaining system. Also, the third identification feature $I_3$ of the 522 may be scanned to identify the serial number and status of the inner pod.

In some embodiments, the thickness $T_1$ of the outer base 512 (e.g., the distance between the upper surface of the upper deck 512a and the lower surface of the lower deck 512b) ranges from 16 mm to 23 mm, and the thickness $T_2$ of the inner pod 520 ranges from 15 mm to 23 mm. In some embodiments, a ratio between $T_1$ and $T_2$ may be in a range from about 0.5 to 1.6. In some embodiments, the ratio may be in a range from about 0.8 to 1.2.

Figure 6A:
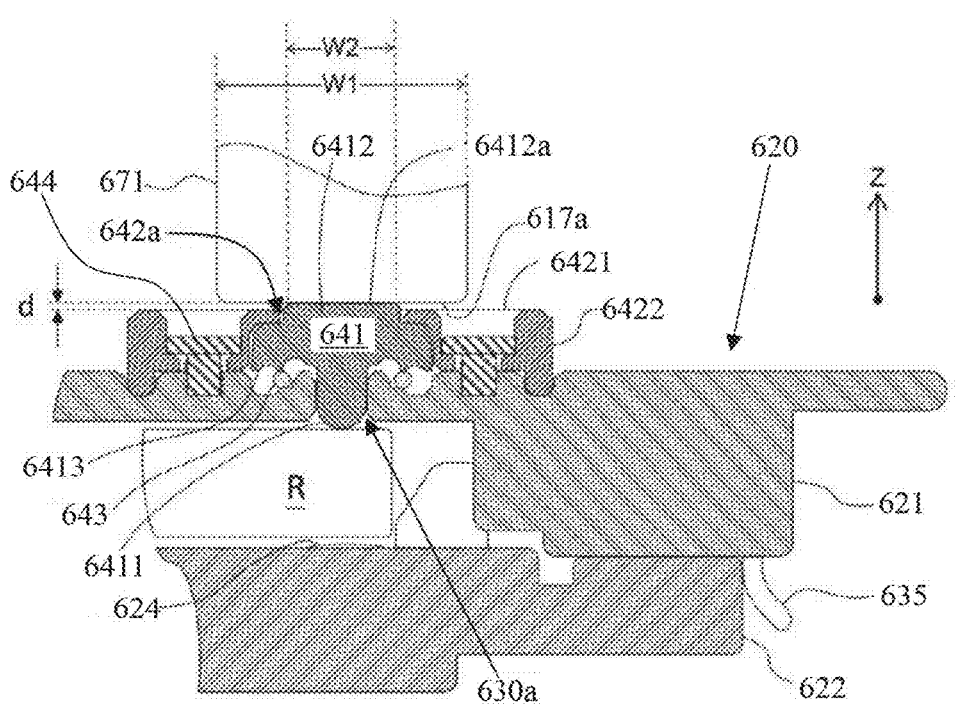
FIGS. 6*a* and 6*b* respectively illustrates a schematic regional cross-sectional view of a container system in accordance with some embodiments of the instant disclosure.

FIG. 6a illustrates a regional cross-sectional view of a container system in accordance with some embodiments of the instant disclosure. For illustrational simplicity and clarity, some detail/sub components of the exemplary device are not explicitly labeled in the instant figure. In some embodiments, the FIG. 6a may be regional cross-sectional views taken in the doted box D indicated in FIG. 4.

In the illustrated embodiment, the hold down pin 641 is provided with a pressing part 6411 configured to press the workpiece, a pressure receiving part 6412 opposite to the pressing part, and a shoulder part 6413 arranged therebetween. The shoulder part 6413 is configured to be wider than the other two parts 6412, 6411. A pressure receiving surface 6412a is defined by the pressure receiving part 6412. In the illustrated embodiment, the pressure receiving surface 6412a is a flat surface arranged opposite to the pressing part 6411. In some embodiments, the hold down pin 641 can be an integrally formed unitary structure made of, for example, an erosion-resistance polymer. Polymeric material not only may reduce the possibility of generating particles but also provide sufficient structural strength, thus enabling proper transmission of external force applied thereon. In some embodiments, the hold down pin 641 may be a composite unit made of multiple subcomponents.

In the illustrated scenario, the inner cover 621 is coupled to the inner base 622. The inner cover 621 is further provided with a guiding member 635 elastically contacts the peripheral of the inner base 622 and provides alignment/guiding during inner pod closure. FIG. 6a further shows that a limiting cap 642 covers (thereby confining) the hold down pin 641 at a shoulder part 6413 thereof. Moreover, a through hole 630a is configured to be narrower than the shoulder part 6413 such that the hold down pin 641 does not drop via the through hole 630a, but rather being confined between the limiting cap 642 and the inner cover 621. In the illustrated embodiment, the hold down pin 641 (e.g., the shoulder part 6413) is supported by an elastic element 643 disposed on inner cover 621 at a first position (e.g., a position where the shoulder part 6413 physically contacts the limiting cap 642). In such position, the hold down pin 641 is confined, by the elastic element 643 and the limiting cap 642. In some embodiments, the shoulder part 6413 of the hold down pin 641 may be designed in a way that the shoulder part 6413 does not touch the limiting cap 642 when being supported by the elastic element 643.

Due to the compressibility of the elastic element 643, the hold down pin 641 is allowed to move toward the workpiece (e.g., reticle R). In the other words, the hold down pin 641 is vertically (e.g., along a z-axis shown in FIG. 6a) movable on the inner cover 621. Meanwhile, a pressing part 6411 of the hold down pin 641 is shown to arranged through the inner cover 621 via the through hole 630a and configured to press the received workpiece (e.g., reticle R). The hold down pin 641 is shown to contact the workpiece (e.g., reticle R) when at the first position, however, in some scenarios, the hold down pin 641 may not touch the workpiece (e.g., reticle R) when at the first position.

A window 642a (e.g., an opening) defined by the limiting cap 642 exposes a pressure receiving surface 6412a of the pressure receiving part 6412, thereby allowing the exposed portion of the pressure receiving surface 6412a to receive downward pressure from a pushing element 671 (e.g., arranged on an outer cover of an outer pod, such as element 171 shown in FIG. 1). In some embodiments, the pressure receiving part extends upwardly (e.g., along a z-axis shown in FIG. 6a) through the window 642a. For example, in the illustrated embodiment, the pressure receiving part 6412 extends upwardly through the window 642a beyond top surface 6421 of the limiting cap 642, wherein the pressure receiving surface 6412a is higher than the top surface 6421 by a distance d.

The pushing element 671 is configured to push the hold down pin 641 at an exposed portion thereof (e.g., the pressure receiving surface 6412a shown in FIG. 6a) so that the hold down pin 641 may exert pressure on the received workpiece (e.g., reticle R). In some scenarios, when an outer cover (e.g., the outer cover 111 shown in FIG. 1) is disposed on the outer base during closure, a pushing surface 671a of the pushing element 671 may push the pressure receiving part 6412. The upper surface (e.g., the pressure receiving surface 6412a shown in FIG. 6a) of the pressure receiving part 6412 is shown to be a flat surface for forming a surface-to-surface contact with the pushing surface 671a. As the outer cover moves toward to the outer base, the pushing surface 671a continues pushing down the hold down pin 641 such that the hold down pin 641 continues to press onto the reticle R. The pushing surface 671a with a larger area (e.g., whose lateral projection entirely covers the pressure receiving part 6412) helps to ensure uniform surface-to-surface contact with the upper surface of the pressure receiving part 6412. As such, the hold down pin 641 may be pressed directly downward with respect to the vertical, so the issue of tilted hold down pin 641 can be alleviated. Meanwhile, the elastic element 643 provides buffer while the hold down pin 641 is being pressed.

In some embodiments, the pushing element 671 is further configured to physically contact the top surface 6421 of the limiting cap 642. In the cross section shown in FIG. 6a, a width W2 of a projected area (i.e., a parallel projection onto a plane, where the projection lines are parallel to each other and extending along, for example, the z-axis) of the exposed portion of the pressure receiving surface 6412a is smaller than that (e.g., W1 shown in FIG. 6a) of the pushing element 671. Under such arrangement, the top surface 6421 of the limiting cap 642 may serve as a limiting surface. That is, when the pushing element 671 is moved toward the received reticle R, its downward motion may be terminated when the pushing element 671 physically contacts the limiting surface (e.g., top surface) 6421 of the limiting cap 642. Thus, the hold down pin 641 reaches a second position (shown in FIG. 6b) that is lower than the first position as previously described. In some embodiments, the material of the limiting cap 642 may possess higher structural strength than the pushing element. For example, the material for the limiting cap 642 may include metal, alloy, or similar material(s). Therefore, the pressure applied to the workpiece (e.g., reticle R) may be limited within a designed threshold, thus protecting the workpiece (e.g., reticle R) from being overly pressured. In the illustrated embodiment, the pressure receiving surface 6412a is arranged at an elevation that is higher than the top surface 6421 of the limiting cap 642 by the distance d, which is also the travel distance (i.e., the distance between the first and the second position) of the hold down pin 641.

In some embodiments, the projected area of the exposed portion of the pressure receiving surface 6412a is smaller than that of the pushing element 671. For example, the area of the pushing surface 671a shown in FIG. 6a is greater than the area of the upper surface (e.g., pressure receiving surface 6412a) of the pressure receiving part 6412.

In some embodiments, the elastic element 643 may be further configured to provide a certain degree of air-tightness between the hold down pin 641 and the inner cover 621. For example, the elastic element 643 has an annular structure that surrounds the through hole 630a defined by the inner cover 621, thereby providing a certain degree of air-tightness between the hold down pin 641 and the inner cover 621. In some embodiments, the elastic element 643 may be an O-ring.

Figure 6B:
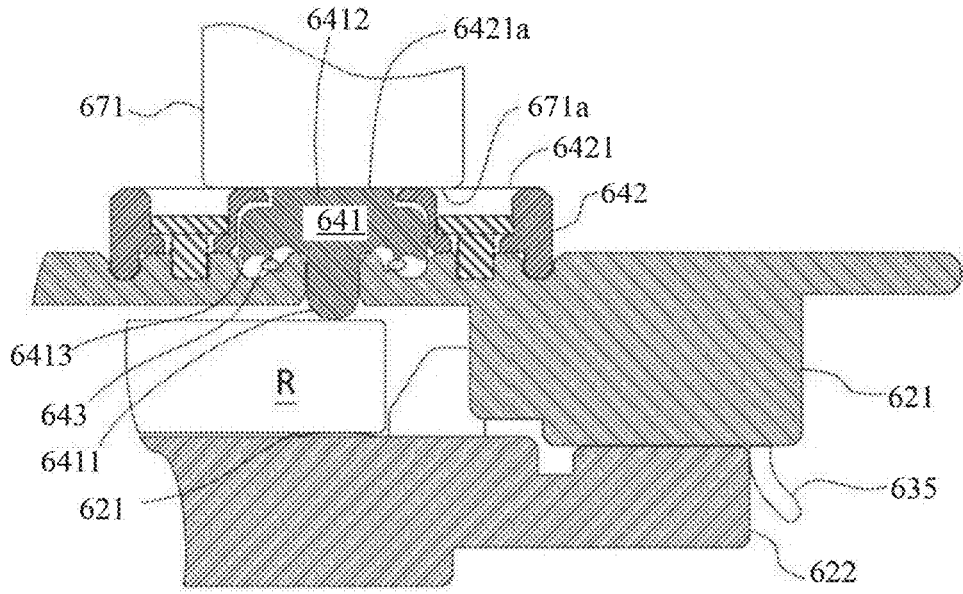

FIG. 6b illustrates a cross-sectional view of a hold down pin at a second position in accordance with some embodiments of the instant disclosure. In some embodiments, when the outer cover is coupled to the outer base, the hold down pin is depressed and maintained at the second position. In the illustrated embodiment, the pushing surface 671a of the pushing element 671 concurrently physically contacts the pressure receiving part 6412 of the hold down pin 641 and the limiting surface 6421 of the limiting cap 642. Moreover, the workpiece (e.g., reticle R) is being pressed (e.g., at a corner region of its upper surface) by the hold down pin 641. Accordingly, the workpiece (e.g., reticle R) may be properly supported at its lower side by the workpiece supporting post 624 while being securely retained at a substantially leveled orientation.

In the illustrated embodiment, when the pushing element 671 physically contacts the limiting surface 6421 (e.g., at a pod closure state), a top surface (e.g., limiting surface 6421) of the limiting cap 642 and an exposed portion of upper surface (e.g., pressure receiving surface 6412a) of the pressure receiving part 6412 are substantially coplanar. However, in other embodiments, instead of being substantially coplanar, one of the pressure receiving surface and the limiting surface may be arranged closer to the received reticle than the other when the pushing element physically contacts the limiting surface (e.g., at a pod closure state).

In some embodiments, the inner pod 620 may be further provided with a first treatment area and a second treatment area comparable to that of the previous embodiments. A workpiece supporting post 624 may be further arranged at a border region between the first and the second treatment area.

Figure 7:
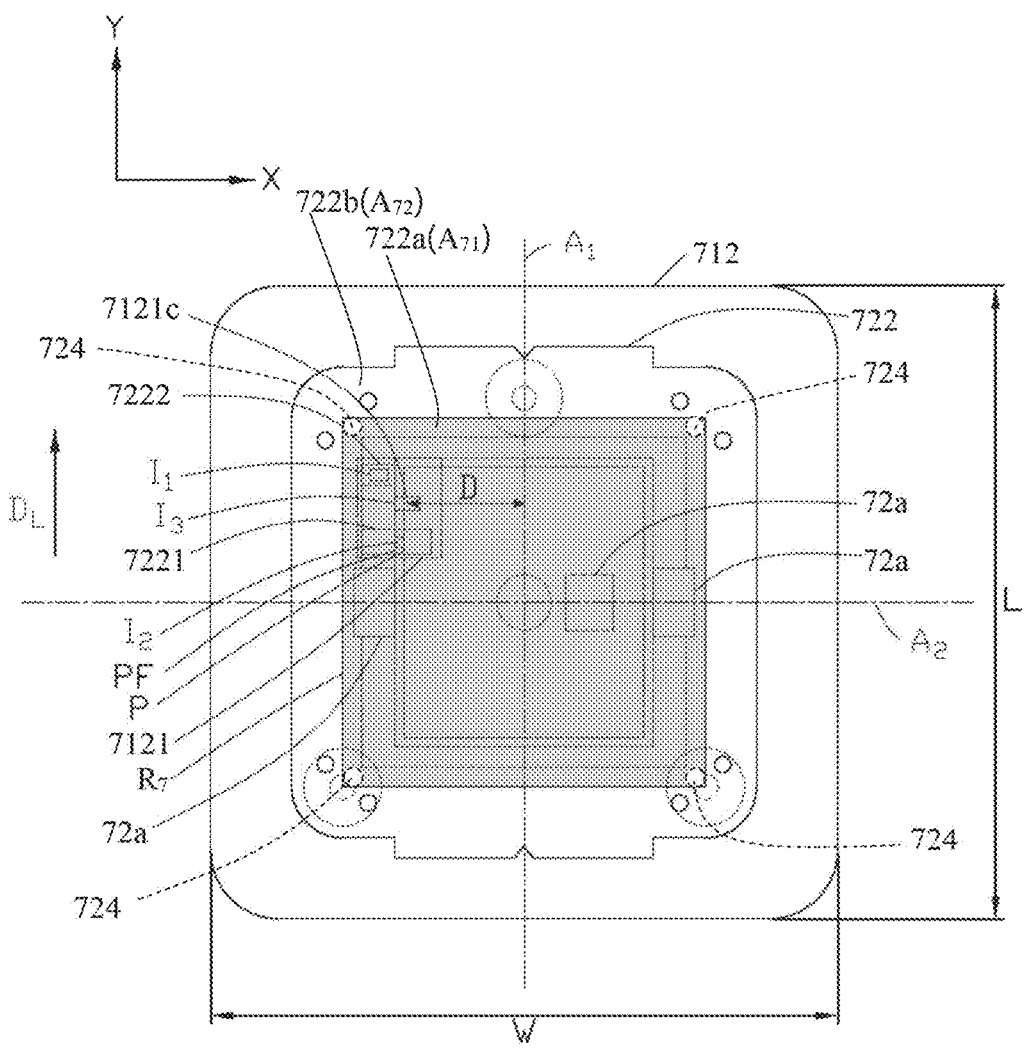
FIG. 7 illustrates a schematic plane view of a container system in accordance with some embodiments of the instant disclosure.

FIG. 7 illustrates plane view of a reticle retaining system in accordance with some embodiments of the instant disclosure. For illustrational simplicity and clarity, some detail/sub components of the exemplary device are not explicitly labeled/shown in the instant figure. For example, an inner cover and an outer cover are not shown in FIG. 7.

In the illustrated embodiment, one of the two inner optical members 7221, 7222 is provided with a greater planar area than the other. For example, form the illustrated plane view, inner optical member 7221 has a greater area than inner optical member 7222.

In the illustrated embodiment, the inner optical member 7221 is designed with greater planar area to allow concurrent optical access to the pellicle P, the second identification feature $I_2$ of the pellicle frame PF and a portion of the pellicle frame PF. On the other hand, the inner optical member 7222 is provided with smaller planar area to allow observation of the first identification feature $I_1$. Meanwhile, the outer optical member 7121 is observably aligned with the two inner optical members 7221, 7222, thereby enabling observation of the pellicle P, the second identification feature $I_2$ of the pellicle frame PF and a portion of the pellicle frame PF, and the first identification feature $I_1$ therethrough.

In the illustrated embodiment, the outer optical member 7121 is configured to allow observation of the third identification feature $I_3$. As such, confirmation on information such as the condition of the reticle $R_7$ the pellicle P, the pellicle frame PF, and the identification features $I_1$, $I_2$, $I_3$ may be achieved by observing through the outer optical member 7121, thereby reducing the number of times the outer pod has to be opened.

In some embodiments, the outer optical member may projectively overlap the pair of inner optical members. In the illustrated embodiment, the two inner optical members 7221, 7222 are arranged to be fully overlapped (e.g., projectively covered) by the outer optical member 7121. In such embodiments, the planar area of the outer optical member is equal or greater than that of the two inner optical members. For example, in the illustrated plane view, the planar area of the outer optical member 7121 is greater than that of the two inner optical members 7221, 7222. In some embodiments, some portions of the two inner optical members may not overlap the outer optical member. In such embodiments, the planar area of the outer optical member may be smaller than that of the two inner optical members.

In the illustrated embodiments, the inner optical members 7221, 7222 are arranged near the third identification feature $I_3$. Such arrangement reduces the planar area of the overlapping outer optical member 7121, thus enhancing a structural strength of the outer base 712. In some embodiments, the inner optical members and the third identification feature may be arranged apart from each other. In such embodiments, the outer base 712 may has additional outer optical members (not shown) corresponding in position to the third identification feature $I_3$ and the inner optical members 7221, 7222, respectively.

In some embodiments, the entire bottom face of the outer base may be designed to act as the second observation zone. For example, an outer optical member may occupy the entire bottom of the outer base.

In the illustrated plane view, the outer optical member 7121 has a substantially rectangular planar profile. The third identification feature $I_3$ is arranged between the two inner optical members 7221, 7222 along a length direction $D_L$ of the rectangular profile of the outer optical member 7121. In some embodiments, the planar profile of the inner optical members 7221, 7222 and the outer optical member 7121 may include one or more rounded portion.

The placement location, material, and planar profile of the optical members (e.g., optical member 7121) may take various factors into consideration, such as weight distribution, structural integrity, and overall weight limit of the device components. As shown in the instant embodiment, the outer optical member 7121 is arranged toward a geometric center of the outer base 712. For instance, a geometric center of the outer optical member 7121 is generally arranged within half the distance from the center of the outer base 712 to the outer fringe thereof in both the x and y direction. Such a layout arrangement may help to retain better overall balance of the outer base 712 while maintaining structural integrity thereof. Moreover, such placement arrangement may help to reserve the periphery region of the base member (e.g., outer base 712) for other functional components, such as sealing and latching mechanisms.

In the illustrated embodiment, a distance D from a geometric center 7121c of the outer optical member 7121 to an axis of symmetry $A_1$ of the outer base 712 is shorter than 30% of a length L of the rectangular profile of the outer base 712. In some embodiments, the distance D may be shorter than 30% of a width W of the rectangular profile of the outer base 712. In some embodiments, the distance D may be around 76 mm; the length L may be around 270 mm; the width W may be around 260 mm.

In some embodiments, a distance from the geometric center 7121c to an axis of symmetry $A_2$ of the outer base 712 is shorter than 30% of the length L and/or the width W of the rectangular profile of the outer base 712.

Moreover, the placement arrangement of the optical members (e.g., optical member 7121) may help to reserve the central region of the base member (e.g., outer base 712) for other functional components, such as supporting mechanisms. As shown in the instant embodiment, the outer optical member 7121 projectively offsets the geometric center of the outer base 712.

In the illustrated embodiment, the distance D from the geometric center 7121c of the outer optical member 7121 to the axis of symmetry $A_1$ of the outer base 712 is longer than 10% of a length L and/or the width W of the rectangular profile of the outer base 712. In some embodiments, a distance from the geometric center 7121c to the axis of symmetry $A_2$ is longer than 10% of the length L and/or the width W. In some embodiments, the geometric center 7121c may be arranged at the central region of the outer base 712.

In the illustrated embodiment, the inner base 722 further comprises additional inner optical members (e.g., optical ports 72a) arranged outside the first observable zone (e.g., the first observable zone $Z_{31}$ shown in FIG. 3). Likewise, the outer base may further be provided with additional outer optical members arranged in correspondence to the additional optical ports 72a of the inner pod. For example, additional outer optical members may be correspondingly arranged in observable alignment with the additional inner optical members 72a. In some embodiments, the number of outer optical members (e.g., optical ports 7121) is less than the number of inner optical members (e.g., ports 7221, 7222, 72a).

In some embodiments, the inner base (e.g., inner base 722) includes a first treatment area that corresponds to the workpiece accommodating region 722a. For example, the shaded region $A_{71}$ that represents the first treatment area has a surface area substantially equal to that of the received workpiece (reticle $R_7$). As shown in the instant figure, the workpiece accommodating region 722a of the exemplary inner base 722 is arranged generally at a geometric center thereof.

In some embodiments, the interior surface (e.g., a periphery area 722b) of the inner base (e.g., inner base 222) is further treated with a second surface treatment. For example, the inner base 722 includes a second treatment area $A_{72}$ arranged around the first treatment area of the inner base. In some embodiments, the second treatment area comprises a hydrophobic treatment area.

The inner base 722 may be further provided with a workpiece supporting post 724 configured to support the workpiece and limit the lateral motion of the workpiece. In some embodiments, the workpiece supporting posts 724 are arranged at a border region between the first treatment area $A_{71}$ and the second treatment area $A_{72}$. In some embodiments, the border region may be defined by the contour of the shaded region $A_{71}$ (e.g., the first treatment area).

Figures 8, 9:
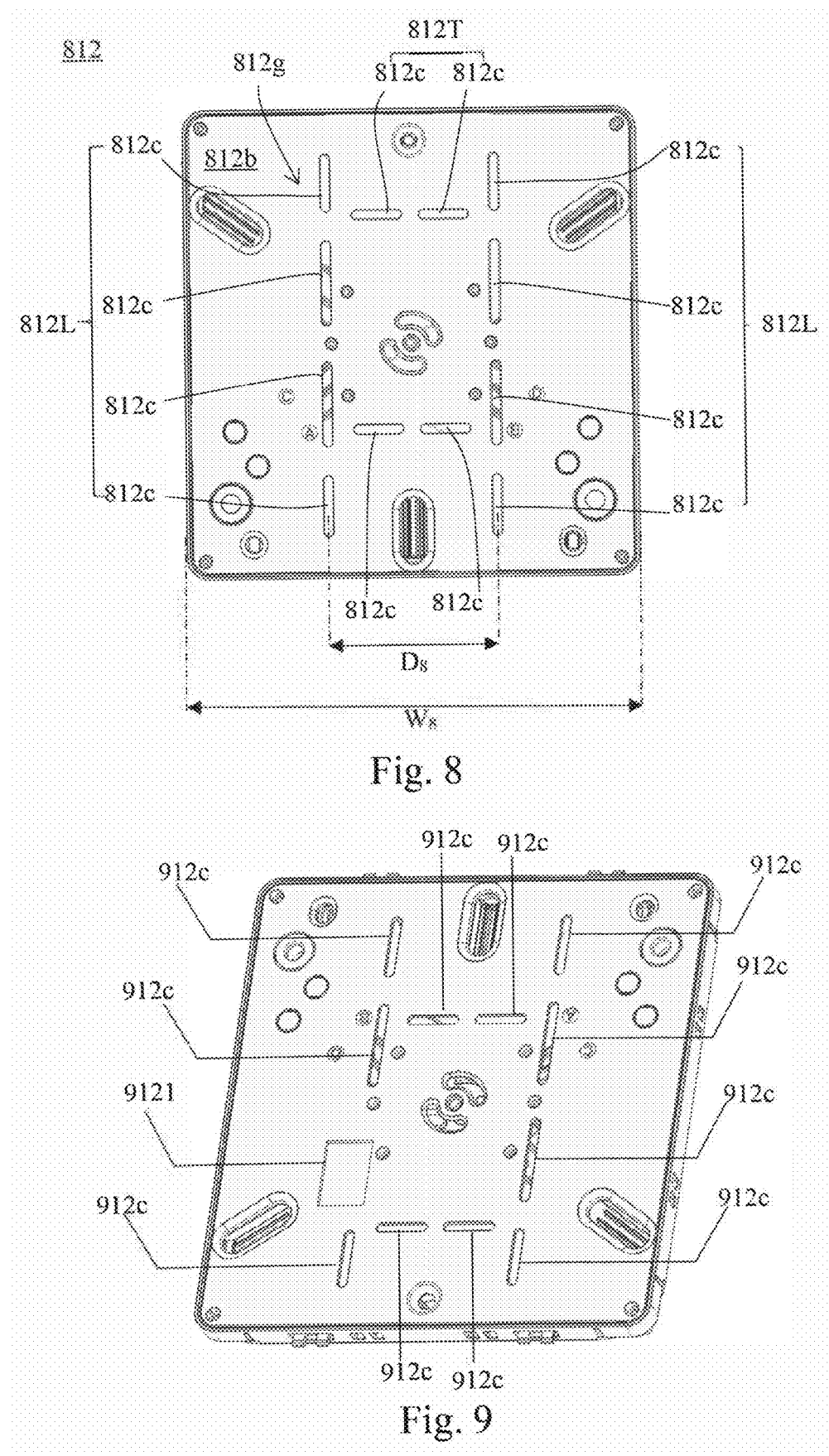
FIG. 8 illustrates a schematic plane view of a container system in accordance with some embodiments of the instant disclosure.
FIG. 9 illustrates a schematic view of a container system in accordance with some embodiments of the instant disclosure.

FIG. 8 illustrates bottom view of a container system in accordance with some embodiments of the instant disclosure. For illustrational simplicity and clarity, some detail/sub components of the exemplary device are not explicitly labeled/shown in the instant figure. In some embodiments, the structure arrangement illustrated in FIG. 8 may be comparable to a bottom view of an outer base (e.g., outer base 112, 312, 412, 512 and/or 712).

After the container is washed/cleaned, some water residual may remain in the hollow body of the outer base 812. In order to allow the water residual to flow out of the hollow body, in some embodiments, the outer base (e.g., outer base 812) that configured to match the outer cover (e.g., outer cover 111 shown in FIG. 1) is provided with a drain hole. Accordingly, the drying/baking time of the outer base may be reduced, thereby promoting equipment utilization rate and energy saving. It also reduces the possibility of water residual in the outer pod, and thus lowers the possibility of residual water causing pollution to the equipment. For example, the exemplary outer base 812 has a hollow body comprising an upper deck (e.g., upper deck 112a shown in FIG. 1) and an opposing lower deck 812b, the lower deck 812b is provided with a drain hole pattern 812g having a plurality of drain holes 812c. The drain holes 812c in the lower deck 812b allows the residual water flows out of the hollow body thereby reducing the amount of residual water in the outer pod base, which may shorten the baking time of the outer pod (e.g. the outer pod 110 shown in FIG. 1).

In some embodiments, one or more mechanical part (such as a latch mechanism) may be accommodated inside the hollow body. However, when cleaning the outer pod, water tends to accumulate around the mechanical part (such as a latch mechanism). For example, the geometric central region of the outer base 812 may be provided with a latch mechanism and may be a region where the residual water tends to stay. In some embodiments, the drain holes (e.g., drain holes 812c) may be arranged proximate/around the geometric central region of the outer base 812 so that the residual water inside the hollow body may be dried faster. For example, six of the exemplary drain holes 812c having elongated structure are arranged to surround the geometric central region of the outer base 812. The exemplary drain hole pattern 812g further includes a double H arrangement that evades the geometric central region of the outer base 812. In some embodiments, the double H arrangement includes a pair of longitudinal portions 812L and a transverse portion 812T arranged between the longitudinal portions 812L. In some embodiments, a ratio between the distance $D_8$ between the two longitudinal portions 812L of the double H arrangement and a width $W_8$ of the outer base ranges from about 30 percent to about 35 percent.

The drainage efficiency is related to the area/size of the drainage trench (e.g., drain holes 812c). In some embodiments, adding additional drainage trench area will further improve efficiency, however, a large projective area of the drain hole pattern may sacrifice the structural integrity of the lower deck 812b. In some embodiments, a ratio between a projective area of the drain hole pattern and an area of the outer base 812 is no greater than 10 percent so that the structural strength of the outer base 812 may be maintained while achieving sufficient drainage effect.

FIG. 9 illustrates bottom view of a container system in accordance with some embodiments of the instant disclosure. For illustrational simplicity and clarity, some detail/sub components of the exemplary device are not explicitly labeled/shown in the instant figure. In some embodiments, the structure arrangement illustrated in FIG. 9 may be comparable to a bottom view of an outer base (e.g., outer base 112, 312, 412, 512 and/or 712).

In some embodiments, the outer base includes a drainage trench (drain hole) and an inspection window (bottom window). The drainage trench is not provided with a light-transmitting element, while the window includes a light-transmitting element (such as glass). In some embodiments, the positioning of the drain holes 912c may evades the location of inspection window (e.g., outer optical member 9121) and screw hole(s) of the outer base. In some embodiments, lateral surface of the outer base may be further provided with drain holes.

The size, aspect ratio, and planar profile of the drain hole may differ from the abovementioned embodiments. In some embodiments, the drainage trench (drain hole) may be rectangular, circular/elliptical, or a rectangular profile with circular arcs at both ends. According to some experimental results, for an individual drainage trench (drain hole), a rectangular profile with circular/curved ends provides ideal drainage capacity. Experimental results also indicate that drainage slots/grooves with elongated pattern profile offer better drainage efficiency than that with a circular profile. In some embodiments, the drain hole pattern comprises a plurality of slots, wherein each of the slots has no sharp corners. A slot (e.g., the drain hole 912c) with rounded ends may reduce the aggregation of water. The cross-sectional profile of the drain hole 912c may be sloped or curved surface.

FIGS. 10 to 14 respectively illustrates a cross sectional profile of drain hole in accordance with some embodiments of the instant disclosure.

Figures 10, 11, 12, 13, 14:
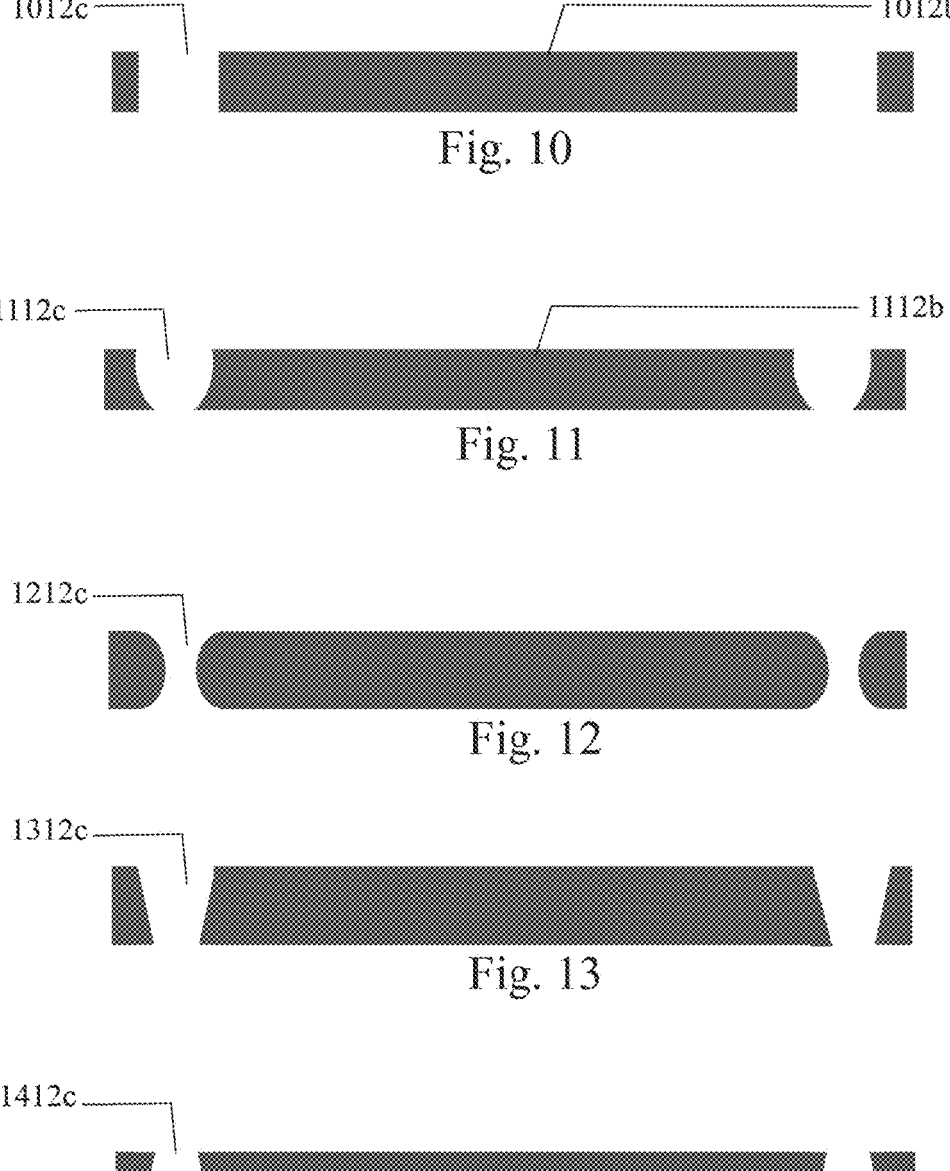
FIGS. 10 to 14 respectively illustrates a cross-sectional profile of a drain hole in accordance with some embodiments of the instant disclosure.

The drain holes may be provided with different cross-sectional profile, for example, vertical, sloped or curved. The exemplary drain hole 1012c of the lower deck 1012b shown in FIG. 10 is provided with a substantially constant width. The drain hole 1112c shown in FIG. 11 is provided with a curved surface and has a gradually downwardly decreasing width. In some embodiments, the drain hole 1112c is further provided with a concave cross-sectional profile. The drain hole 1212c shown in FIG. 12 is provided with a convex cross-sectional profile. The cross-sectional profile of a drain hole 1312c in FIG. 13 has tapered profile provided with a gradually downwardly decreasing width. The cross-sectional profile of a drain hole 1412c in FIG. 14 has tapered profile provided with a gradually downwardly increasing width.

Accordingly, one aspect of the instant disclosure provides a container system, comprising an inner base, configured to receive a workpiece, the inner base including a first treatment area that corresponds to a workpiece accommodating region, a second treatment area arranged around the first treatment area of the inner base, and a workpiece supporting post arranged at a border region between the first treatment area and the second treatment area.

In some embodiments of the present disclosure, the container system further comprises an inner cover configured to match the inner base. The inner cover includes a first treatment area that corresponds to the workpiece accommodating region of the inner cover, a second treatment area arranged around the first treatment area of the inner cover, and a hold down pin arranged in the second treatment area of the inner cover, wherein the hold down pin is provided with charge dissipation property.

In some embodiments of the present disclosure, wherein the inner base and the inner cover are substantially made of metal; wherein the first treatment area comprises a hydrophilic treatment area; and wherein the second treatment area comprises a hydrophobic treatment area.

In some embodiments of the present disclosure, the hydrophobic treatment area is provided with a surface resistance value is less than about $10^{11}\Omega$.

In some embodiments of the present disclosure, a hydrophobic layer over the hydrophobic treatment area has a thickness of less than about 1 um.

In some embodiments of the present disclosure, wherein the inner cover comprises a filter module arranged at a geometric central region thereof; and wherein the hydrophilic region evades the filter module.

In some embodiments of the present disclosure, the container system further comprises an outer cover configured to cover the inner cover. The outer cover comprises a pushing element configured to push the hold down pin at an exposed portion thereof so that the hold down pin presses the workpiece. The hold down pin of the inner cover comprises a pressing part arranged through the inner cover, and configured to press a received workpiece and a pressure receiving surface arranged opposite to the pressing part. A width of a projected area of the exposed portion of the pressure receiving surface is smaller than that of the pushing element.

In some embodiments of the present disclosure, the container system further comprises an outer base configured to match the outer cover and receive the inner base, the outer base is provided with a drain hole pattern.

In some embodiments of the present disclosure, the outer base has a hollow body comprising an upper deck configured to support the inner base and a lower deck opposite to the upper deck, the lower deck is provided with the drain hole pattern.

In some embodiments of the present disclosure, the drain hole pattern has a double H arrangement that evades the geometric central region of the outer base.

Accordingly, another aspect of the instant disclosure provides a container system comprises an outer base and an inner base. The outer base comprises a supporting structure, the outer base having a hollow body comprising an upper deck configured to support the inner base and a lower deck opposite to the upper deck, the lower deck is provided with a drain hole pattern, the drain hole pattern surrounds the geometric central region of the lower deck. The inner base is configured to receive a workpiece, the inner base includes a first treatment area that corresponds to a workpiece accommodating region, a second treatment area arranged around the first treatment area, and a workpiece supporting post arranged at a border region between the first treatment area and the second treatment area.

In some embodiments of the present disclosure, the drain hole pattern has a double H arrangement that evades the geometric central region of the outer base.

In some embodiments of the present disclosure, the double H arrangement includes a pair of longitudinal portions and a transverse portion arranged between the longitudinal portions.

In some embodiments of the present disclosure, a ratio between the distance between the longitudinal portions of the double H arrangement and a width of the outer base ranges from 30 percent to 35 percent.

In some embodiments of the present disclosure, a ratio between a projective area of the drain hole pattern and an area of the outer base is no greater than 10 percent.

In some embodiments of the present disclosure, the drain hole pattern comprises a plurality of slots, wherein each of the slots has no sharp corners.

In some embodiments of the present disclosure, the inner base has: a workpiece accommodating region arranged generally at a geometric center thereof and surrounded by a periphery region, and a first observable zone defined in the workpiece accommodating region correspondingly arranged to allow observation of the workpiece. The outer base has a second observable zone defined thereon observably aligned to the first observable zone of the inner base upon receiving the inner base.

In some embodiments of the present disclosure, a number of window in the first observable zone of the inner base is greater than that in the second observable zone.

In some embodiments of the present disclosure, the inner base is substantially made of metal; the supporting post of the inner base is provided with charge dissipation property.

In some embodiments of the present disclosure, the first treatment area comprises a hydrophilic treatment area; and the second treatment area comprises a hydrophobic treatment area.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the teams used in the claims. It will therefore be appreciated that the embodiments described above may be modified within the scope of the claims.

What is claimed is:

1. A container system, comprising:
an inner base configured to receive a workpiece, the inner base comprising:
a first inner base treatment area corresponding to a workpiece accommodating region of the inner based,
a second inner base treatment area arranged around the first inner base treatment area, and
a workpiece supporting post arranged at a border region between the first inner base treatment area and the second inner base treatment area;
an inner cover configured to match the inner base, the inner cover comprising:
a first inner cover treatment area corresponding to a workpiece accommodating region of the inner cover,
a second inner cover treatment area arranged around the first inner cover treatment area, and
a hold down pin located on the first inner cover treatment area and surrounded by the second inner cover treatment area; and
an outer cover configured to cover the inner cover, the outer cover comprising a pushing element configured to push the hold down pin at an exposed portion of the inner cover, such that the hold down pin presses the workpiece,
wherein:
the hold down pin of the inner cover comprises a pressing part, the pressing part arranged through the inner cover and configured to press the workpiece and a pressure receiving surface that is arranged opposite the pressing part, a width of a projected area of an exposed portion of the pressure receiving surface being smaller than a width of a projected area of the pushing element,
the first inner base treatment area comprises a hydrophilic treatment area, and
the second inner base treatment area comprises a hydrophobic treatment area.

2. The container system of claim 1,
wherein the hold down pin is provided with a charge dissipation property.

3. The container system of claim 1,
wherein the inner base and the inner cover are substantially made of metal.

4. The container system of claim 1,
wherein the hydrophobic treatment area is provided with a surface resistance value less than $10^{11}\Omega$.

5. The container system of claim 1,
wherein a hydrophobic layer over the hydrophobic treatment area has a thickness of less than 1 um.

6. The container system of claim 1,
wherein the inner cover further comprises a filter module arranged at a geometric central region of the inner cover, and
the hydrophilic treatment area evades the filter module.

7. The container system of claim 1, further comprising:
an outer base configured to match the outer cover and receive the inner base, wherein the outer base is provided with a drain hole pattern.

8. The container system of claim 7,
wherein the outer base has a hollow body comprising an upper deck that is configured to support the inner base and a lower deck opposite the upper deck, and the lower deck is provided with the drain hole pattern.

9. The container system of claim 7,
wherein the drain hole pattern has a double H arrangement that evades a geometric central region of the outer base.

10. A container system, comprising:
an outer base comprising a supporting structure, the outer base having a hollow body comprising an upper deck and a lower deck opposite the upper deck,
wherein the lower deck is provided with a drain hole pattern that surrounds a geometric central region of the lower deck;
an inner base configured to receive a workpiece, the inner base comprising:
a first inner base treatment area corresponding to a workpiece accommodating region of the inner base,
a second inner base treatment area arranged around the first inner base treatment area, and
a workpiece supporting post arranged at a border region between the first treatment inner base area and the second inner base treatment area;
an inner cover configured to match the inner base, the inner cover comprising:
a first inner cover treatment area corresponding to a workpiece accommodating region of the inner cover,
a second inner cover treatment area arranged around the first inner cover treatment area, and
a hold down pin located on the first inner cover treatment area and surrounded by the second inner cover treatment area; and
an outer cover configured to cover the inner cover, the outer cover comprising a pushing element configured to push the hold down pin at an exposed portion of the inner cover, such that the hold down pin presses the workpiece,
wherein;
the upper deck is configured to support the inner base,
the hold down pin of the inner cover comprises a pressing part, the pressing part arranged through the inner cover and configured to press the workpiece and a pressure receiving surface that is arranged opposite the pressing part, a width of a projected area of an exposed portion of the pressure receiving surface being smaller than a width of a projected area of the pushing element, the first inner base treatment area comprises a hydrophilic treatment area, and the second inner base treatment area comprises a hydrophobic treatment area.

11. The container system of claim 10, wherein the drain hole pattern has a double H arrangement that evades a geometric central region of the outer base.

12. The container system of claim 11, wherein the double H arrangement includes a pair of longitudinal portions and a transverse portion arranged between the longitudinal portions.

13. The container system of claim 12, wherein a ratio between a distance between the longitudinal portions of the double H arrangement and a width of the outer base ranges from 30 percent to 35 percent.

14. The container system of claim 10, wherein a ratio between a projective area of the drain hole pattern and an area of the outer base is equal to or less than 10 percent.

15. The container system of claim 10, wherein the drain hole pattern comprises a plurality of slots, each of the plurality of slots has a rounded or elliptic profile, or has an elongated pattern profile with rounded ends.

16. The container system of claim 10, wherein the inner base further comprises:

the workpiece accommodating region of the inner base arranged generally at a geometric center of the inner base and surrounded by a periphery region; and a first observable zone defined in the workpiece accommodating region of the inner base correspondingly arranged to allow observation of the workpiece, wherein the outer base has a second observable zone defined thereon observably aligned to the first observable zone of the inner base upon receiving the inner base.

17. The container system of claim 16, wherein a number of windows in the first observable zone is greater than a number of windows in the second observable zone.

18. The container system of claim 10, wherein the inner base is substantially made of metal, and the workpiece supporting post is provided with a charge dissipation property.

\*    \*    \*    \*    \*